United States Patent [19]
Aoki et al.

[11] Patent Number: 5,422,995
[45] Date of Patent: Jun. 6, 1995

[54] METHOD AND MEANS FOR FAST WRITING OF RUN LENGTH CODED BIT STRINGS INTO BIT MAPPED MEMORY AND THE LIKE

[75] Inventors: Yutaka Aoki, Fujisawa; Yuji Gohda, Himeji, both of Japan; Darwin P. Rackley, Boca Raton, Fla.

[73] Assignee: International Business Machines Corporation, Armonk, N.Y.

[21] Appl. No.: 32,084

[22] Filed: Mar. 16, 1993

[30] Foreign Application Priority Data

Mar. 30, 1992 [JP] Japan ................................ 4-074029

[51] Int. Cl.⁶ ............................................ G06F 15/20
[52] U.S. Cl. ...................................... 395/162; 395/166
[58] Field of Search ................ 395/128, 133, 141, 200, 395/162, 163, 121, 122, 123, 126, 127, 133, 134, 135, 138, 162, 164, 166; 358/261.1, 261.2, 261.4, 500; 364/255.1, 256.8, 955, 961.3

[56] References Cited

U.S. PATENT DOCUMENTS

| 4,868,764 | 9/1989 | Richards | 395/128 |
| 4,870,498 | 9/1989 | Schoon | 358/261.4 |
| 5,113,494 | 5/1992 | Menendez et al. | 395/163 |
| 5,295,235 | 3/1994 | Newman | 395/133 |

OTHER PUBLICATIONS

"Text Compression" Bell et al. copyright 1990 by Prentice-Hall Inc. pp. 20–23.

Primary Examiner—Mark R. Powell
Assistant Examiner—U. Chauhan
Attorney, Agent, or Firm—R. Bruce Brodie; Paik Saber

[57] ABSTRACT

A method and means which upon detecting indicia embedded in a decoded run length coded bit string skips over a range of bit memory mapped addresses thus reducing the number of write operations into a counterpart bit mapped memory. The coded indicia include portions which specify a skip and a skip range for storage locations in said bit mapped memory.

7 Claims, 9 Drawing Sheets

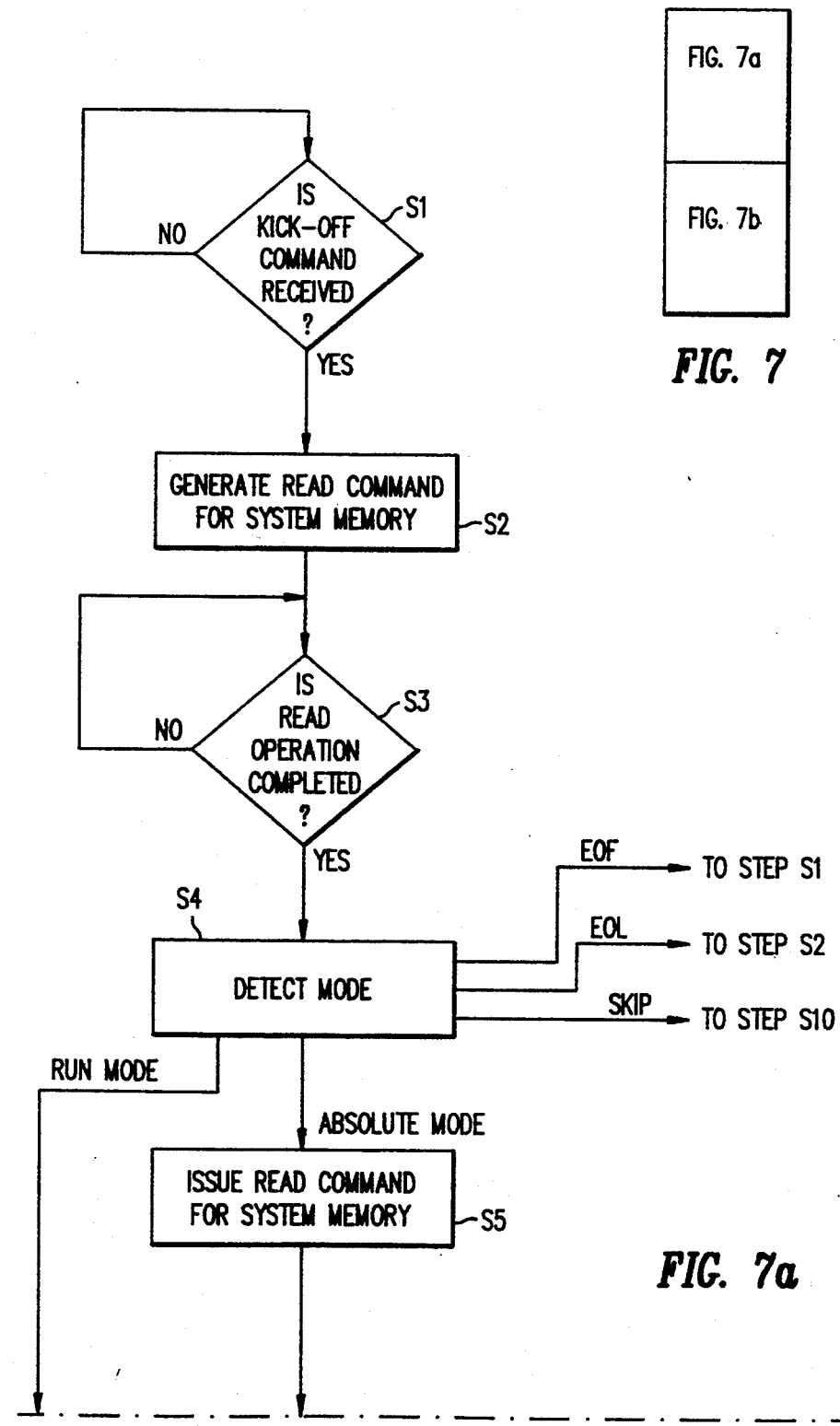

METHOD AND MEANS FOR FAST WRITING OF RUN LENGTH CODED BIT STRINGS INTO BIT MAPPED MEMORY AND THE LIKE

FIELD OF THE INVENTION

This invention relates to the compression and expansion of bit coded information strings, and more particularly, to increasing the speed at which run length coded bit strings may be written into counterpart bit mapped memories such as are used to drive video graphics displays and the like.

DESCRIPTION OF RELATED ART

A run length code method is known as one of data compression methods for color image data. An example of a run length code comprises a pair of bytes the first and second bytes of which indicate a color to be displayed and the number of pixels of the continuous color indicated by the first byte on a display apparatus, respectively. A run length code used as color image data is read from an external storage apparatus such as a CD-ROM, etc. into the system memory of a data processing apparatus where it is decoded and stored into a bit map memory. The storage locations of the bit map memory correspond to the display positions on the screen of the display apparatus and the data written into the bit map memory is displayed on the display apparatus by means of a video controller. Incidentally, the conventional method for writing decoded run length codes into the bit map memory has a disadvantage that the processing is not always performed at a high speed.

Illustrative of the prior art is Bell et. al., "Text Compression", copyright 1990 by Prentice-Hall Inc., Prentice Hall Advanced Reference Series at pages 20–23. Bell points out that run length coding compresses information reversibly where sequences of consecutively identical characters are replaced by data indicative of the length of the run. He observes that run length coding is especially useful where there is high inter symbol influence. That is, given that a symbol has occurred, that symbol is more likely to reoccur next.

Japanese Published Unexamined Patent Application (PUPA) No. 61-7769 discloses a method for controlling write-to-image memory in which converting means for converting image data into run length data, an image memory for storing the run length data, means for writing either "1" or "0" of an initial value into all areas of the image memory prior to writing the converted data into the image memory, and an adder for adding a run length value to a value in an address register for addressing the image memory- are provided, and data having the same polarity as the initial value (1 or 0) previously written into the image memory is not written into the image memory and the value of the address register for addressing is updated, while data having the opposite polarity to the initial value is written into the image memory. This prior art, however, relates to an art for writing a run length code into memory as it is, not to an art for decoding the run length code. Further, the prior art is applied only to monochrome image data, not to color image data.

SUMMARY OF THE INVENTION

It is accordingly an object of the present invention devise a method and means for decoding run length (RL) codes and writing the decoded RL codes into a bit map memory at a faster rate.

This object is satisfied by a method and means which upon detecting indicia embedded in a decoded RL bit string skips over a range of bit memory mapped addresses thus reducing the number of write operations into a counterpart bit mapped memory. The coded indicia include portions which specify a skip and a skip range for storage locations in said bit map memory.

DESCRIPTION OF THE PREFERRED EMBODIMENT

Figure 1:
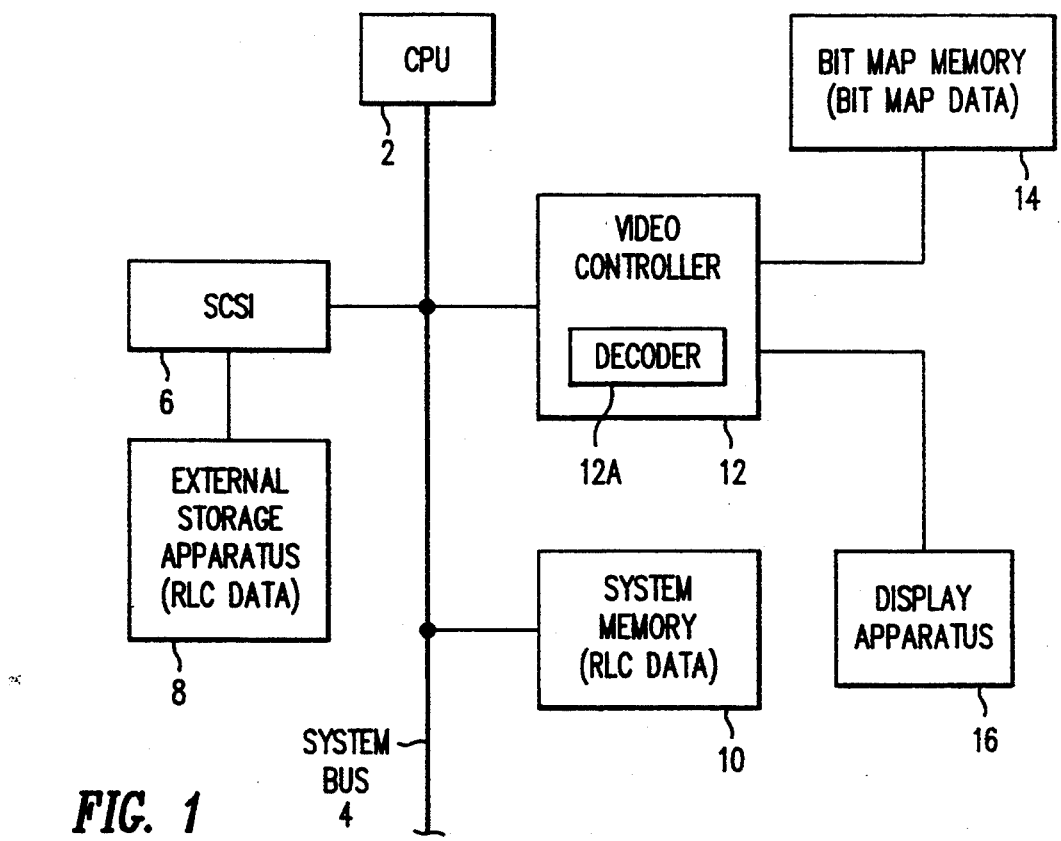
FIG. 1 is a block diagram showing the whole configuration of an embodiment of a data processing system according to the present invention.

Referring now to FIG. 1 there is shown the overview configuration of an embodiment of a data processing system according to the present invention. CPU 2 is connected to a system bus 4 to which an external storage apparatus 8 such as CD-ROM, etc. is also connected through a SCSI interface 6. Connected to the system bus 4 are a system memory 10, and a bit map memory 14 and a color display apparatus 16 such as a color CRT, etc. through a video controller 12. The external storage apparatus 8 stores display data represented based on a run length code. The run length code data in the external storage apparatus 8 is read out by the CPU 2 and stored in the system memory 10 and then decoded by the video controller 12, and the decoded data is written into the bit map memory 14. The bit map memory 14 is a kind of video buffer. The storage locations of the bit map memory 14 and display positions on the display apparatus 16 correspond to each other. The video controller 12 reads out data from the bit map memory 14, converts -it to a video signal, and then transfers it to the display apparatus 16.

TABLE 1

| First Byte (L Byte, Even Address) | Second Byte (H Byte, Odd Address) | Definiton |
|---|---|---|
| 00H | 00H | EOL: End of Line |
| 00H | 01H | EOF: End of Frame |
| 00H | 02H | Skip Entry |
| 00H | 03H - FFH | Absolute Mode Entry |
| 01H-FFH (Designate No. of pixels) | 00H-FFH (Designate color) | Run mode |

A run length code according to the embodiment is comprised of two bytes (one word) as shown in Table 1. The first byte (L byte) of the run length code specifies the number of pixels for displaying continuously the same color, and on the other hand the second byte (H byte) specifies a type of color. In a run mode, on the assumption that two continuous bytes are a run length code, the video controller 12 operates so that a color specified by the second byte is repeatedly, written by a number corresponding to the number of pixels specified by the first byte, into the storage locations of the bit map memory 14. In an absolute mode, on the assumption that both the first and second bytes following an absolute mode entry (L byte: 00H, H byte: 03H-FFH) merely specify the color of each pixel, the video controller 12 operates so that data stored in the system memory 10 is written into the bit map memory 14.

Now, a code whose first byte (L byte) is 00H is hereinafter called an extra code. Table 1 shows the specification of extra codes. An extra code whose second byte (H byte) is 00H indicates the end of display line (EOL). For this code, the video controller 12 moves a storage location (address point) of the bit map memory 14, even if a current display position is in the middle of a display line, to an address corresponding to a display position at the top of the next display line. An extra code whose second byte is 01H indicates the end of frame (EOF). For this code, the video controller 12 moves an address point of the bit map memory 14 to an address corresponding to a display position at the top of the next frame. An extra code whose second byte is 03H to FFH indicates the absolute mode. For this code, the video controller 12 sequentially reads out data for the number of pixels specified by the second byte from the system memory 10 and writes it into the bit map memory 14.

Now, an extra code whose second byte (H byte) is 02H is hereinafter called a skip entry (skip specification). The skip entry moves an address point in the bit map memory by a range specified by two bytes following the skip entry. A first byte (L byte) and second byte (H byte) following the skip entry specifies the number of pixels to be skipped in the horizontal direction and the number of display lines to be skipped in the vertical direction, respectively. Data within the range skipped by the skip entry in the bit map memory 14 is not rewritten and remains unchanged.

Figure 2:
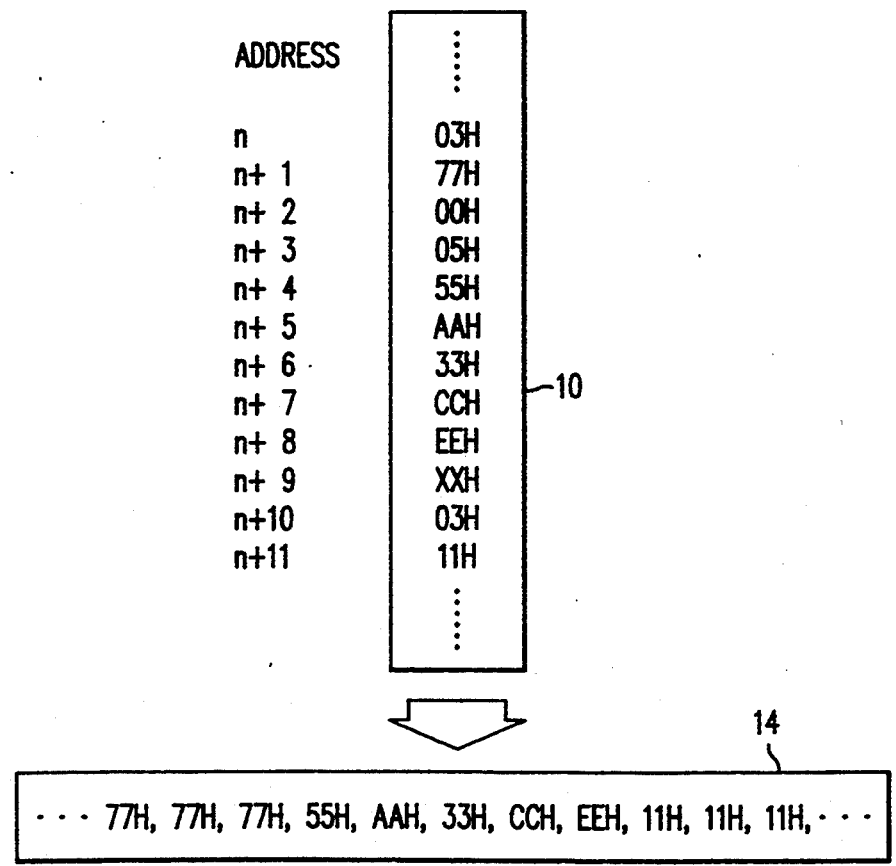
FIG. 2 is a diagram showing an example of extra codes in run length codes in said embodiment.

FIG. 2 shows an example of data before being decoded in the system memory 10 and data decoded and stored in the bit map memory 14. In this example, 8-bit data is represented for each pixel. "03H" in address n and "77H" in address (n+1) of the system memory 10 indicate that three pixels of a color specified by 77H are continuous. Therefore, decoded data becomes "77H, 77H, 77H". "00H" in address (n+2) and "05H" in address (n+3) indicate an extra code formed into an absolute mode entry. This absolute mode entry indicates the absolute mode is continuous within the range of five pixels. Therefore, the 5-byte data of "55H, AAH, 33H, CCH, EEH" following the absolute entry is written also into the bit map memory 14, as it is. In this case, data in address (n+9) is ignored and does not affect data in the bit map memory 14. "03H" in address (n+10) and "11H" in address (n+11) indicate that three pixels of a color specified by 11H are continuous, and therefore decoded data becomes "11H, 11H, 11H".

Figure 3:
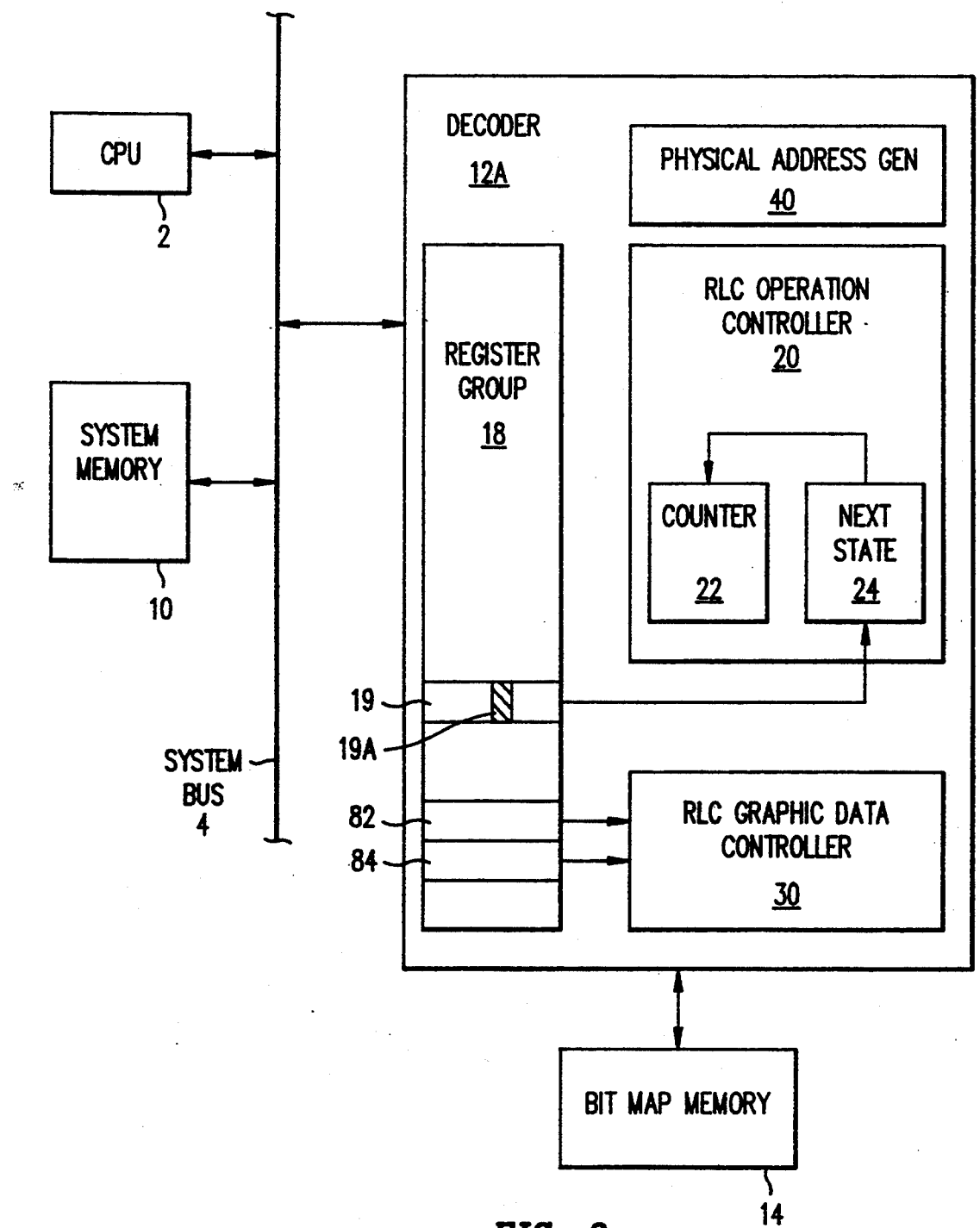
FIG. 3 is a block diagram showing the configuration of a RLC decoder of said embodiment.

FIG. 3 shows the configuration of a decoder 12A for run length codes (RLC) in the video controller 12. The main components of the RLC decoder 12A are an I/O register group 18, a RLC operation controller 20, a RLC graphic data controller 30, and a physical address generating circuit 40. The I/O register group 18 can be written thereto by the CPU 2. The decoder 12A starts to operate when a value of a predetermined bit position (start operation instruction bit) of a start operation register 19 in the I/O resister group 18 is rewritten from 0 to 1. The start operation instruction for the decoder 12A is executed by the CPU 2 when an value of a certain bit 19A of the start operation register 19 is set to 1 (true). A value of the certain bit 19A is always supplied to a next state generating circuit 24 (FIG. 4) in the RLC operation controller 20. The RLC operation controller 20 interprets the first and second bytes of a run length code to determine an operation of the RLC decoder 12A. The RLC graphic data-controller 30 generates data to be written into the bit map memory 14 based on data from the system memory 10, in accordance with an operation mode. The physical address generating circuit 40 generates an address of the bit map memory 14 upon the time when decoded data is written thereto.

Figure 4:
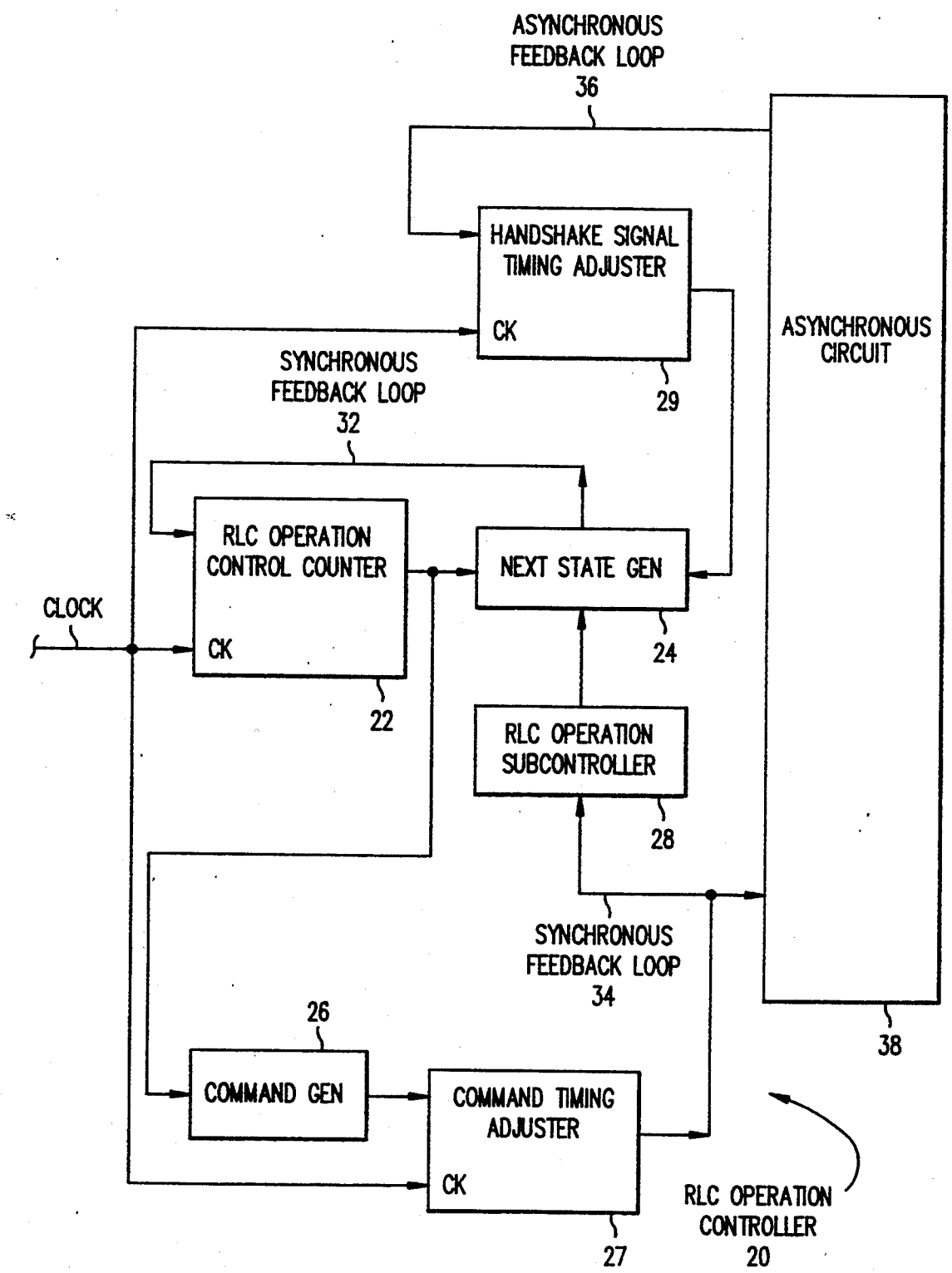
FIG. 4 is a block diagram showing the configuration of a RLC operation controller in the RLC decoder.

FIG. 4 shows the configuration of the RLC operation controller 20. The RLC operation controller 20 comprises a RLC operation control counter 22, a next state generating circuit 24, a command generating circuit 26, a command timing adjuster 27, a RLC operation sub controller 28, a handshake signal timing adjuster 29, and an asynchronous circuit 38. The RLC operation control counter 22 includes two synchronous feedback loops 32 and 34 and one asynchronous feedback loop 36. Following (next) state is formed by a current state and data from two synchronous feedback loops 32 and 34. The next state is generated at each rise of a clock signal.

Figure 5:
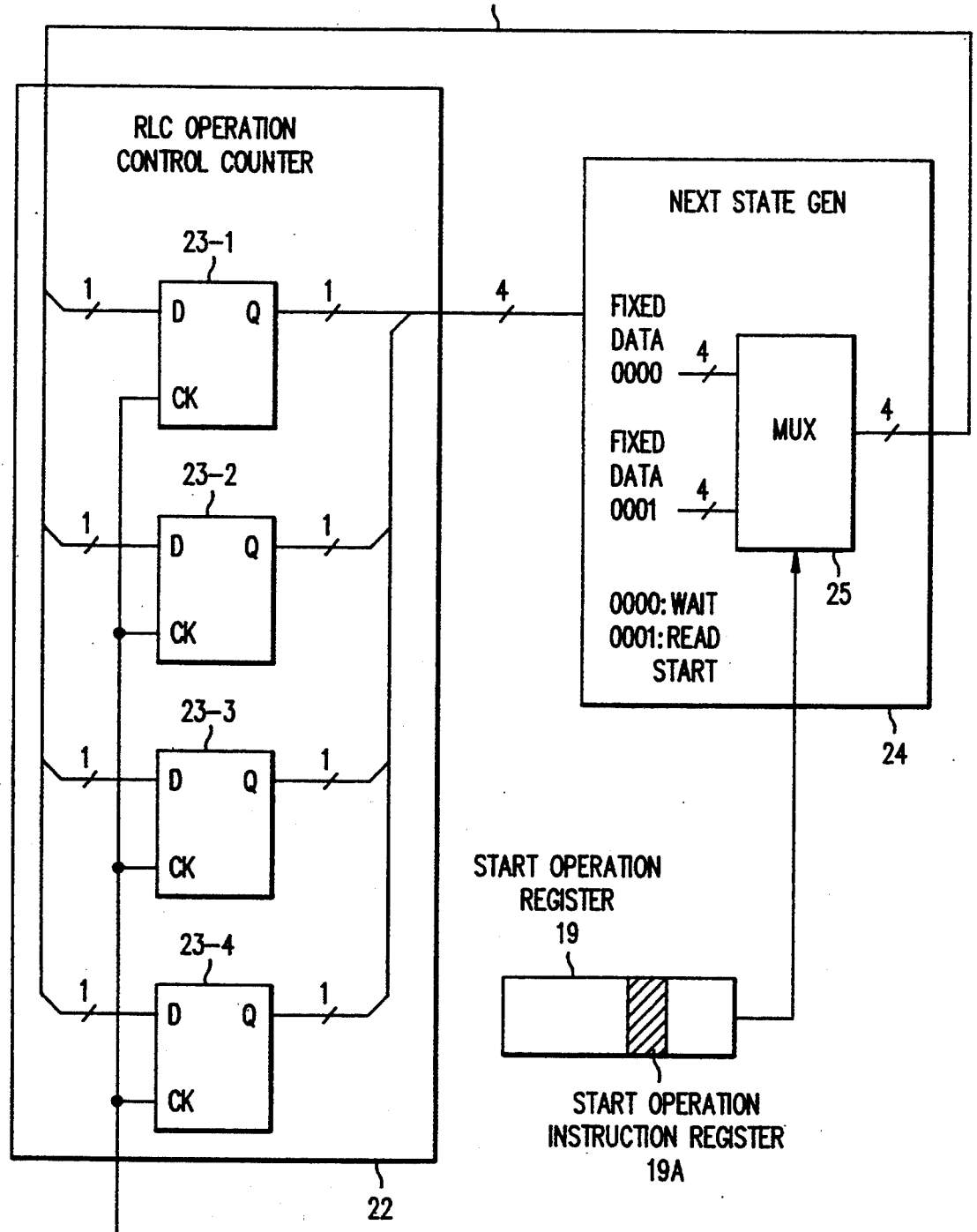
FIG. 5 is a block diagram showing the configuration of a RLC operation control counter in the RLC decoder.

FIG. 5 shows the RLC operation control counter 22 and the next state generating circuit 24. The RLC operation control counter 22 comprises four D type flip-flops 23-1, 23-2, 23-3, and 23-4 arranged in parallel and is a kind of state machine which transits among plural state where the overall operation of the decoder 12A is regulated. All of the D type flip-flops 23-1 to 23-4 are reset at the time of power supply and continue to wait until the start operation instruction is provided to the decoder 12A. The next state generating circuit 24 includes a multiplexer (MUX) 25, which is driven by the start operation instruction bit 19A. The MUX 25 is driven by the start operation instruction bit 19A in the timing of a clock signal. Inputted to two inputs of the MUX 25 are 4-bit fixed data "0000" and 4-bit fixed data "0001". The fixed data "0000" and the fixed data "0001" correspond to a wait state and a start operation state, respectively. The 4-bit output of the MUX 25 is provided, through the synchronous feedback loop 32, to each of four D type FFs 23-1, 23-2, 23-3, and 23-4.

Depending on whether the CPU 2 writes 1 into the start operation instruction bit 19A, the RLC operation control counter 22 starts the first operation for decoding RLC or continues the wait state. A value of the start operation instruction bit 19A causes an output value of the four D-type FFs 23-1, 23-2, 23-3, and 23-4 to be a value (0001) indicating the first operation for decoding RLC or a value (0000) indicating the wait state. After the operation starts, the start operation instruction bit 19A holds a value indicating in operation until the decoder 12A receives a decoded code. At the time when the operation of the decoder 12A is completed, the RLC operation controller 20 sends a reset signal to the start operation register 19 to reset the start operation instruction bit 12A. Thereby, the RLC operation control counter 22 becomes the wait state. Until the CPU 2 causes the start operation instruction bit 19A to be set to 1 again, the RLC operation control counter 22 remains the wait state.

The next state generating circuit 24 calculates the next state of the RLC operation control counter 22. There are three cases where the next state is calculated. The first case uses the synchronous feedback loop 32. The synchronous feedback loop 32 is formed by the next state generating circuit 24 and the RLC operation control counter 22. In the first case, the next state generating circuit 24 calculates the next state based on only information on a current state the RLC operation control counter holds.

The synchronous feedback loop 32 is used to avoid going to a state (lock-up state) where an operation cannot be stopped by the involvement of the RLC operation control counter 22 in an undefined state. Since RLC operation control counter 22 comprises four D-type flip-flops 23-1 to 23-4, up to 16 states can be specified. However, the embodiment specifies only 13 states (See later Table 2). A noise, etc. may cause an output of the RLC operation control counter 22 to be any of three undefined states—"1101", "1110", and "1111". Therefore, if the RLC operation control counter 22 becomes any of these three states, the synchronous feedback loop 32 tries to set it to "0000 (wait state)" at the next clock.

The first case referred to herein before involves also an operation for transiting to the first operation for decoding RLC from the wait state. The first case differs from a feedback operation based on only the synchronous feedback loop 32 in that a value of the start operation instruction bit 19A to be inputted to the next state generating circuit 24 is involved with determining a state thereof. In addition to avoiding the state lock-up, there are five cases where the next state is determined by only the synchronous feedback loop 32. In three cases out of these five cases, an intermediate state is provided between an operation performed in a current state and the next operation to be performed. To be more concrete, there is the case of the transition to a state that an operation for reading out the system memory is started, the case of the transition to a state that a write operation for the bit map memory is started, and the case of determination of an operation state after pseudo write operation described later and the detection of the end of skip mode.

The second case uses the synchronous feedback loop 34. The synchronous feedback loop 34 is formed by the command generating circuit 26, the command timing adjuster 27, the RLC operation sub controller 28, the next state generating circuit 24, and the RLC operation control counter 22. In the second case, the synchronous feedback loop 32, as well as the synchronous feedback loop 34, is used. That is, the next state generating circuit 24 considers the current state information retained by the RLC operation control counter 22 and information from the RLC operation sub controller 28 collectively to determine the next state. A value of the next state finally provided to the RLC operation control counter 22 is provided to the synchronous feedback loop 32.

The second case referred to herein before involves the following three cases. One is a case of the transition of a state in response to a mode (any of the following modes; run mode, absolute mode, skip mode, end of line mode, end of frame, and end of operation mode) specified after a code including mode information in a RLC code is read out from the system memory 10. Another is a case of repetition of a write operation for the bit map memory 14 in the run mode. The third is a case where a skip is continued in the skip mode.

The synchronous feedback loop 34 includes the command generating circuit 26 and the command timing adjuster 27 for the following reason. That is, Information outputted from the RLC operation sub controller 28 is affected by a result of a command just executed. For example, at the time of mode transition, a RLC code including mode information is read in immediately before the mode transition and the read information is retained in the RLC operation sub controller 28 to interpret which of modes. That is, the output information from the RLC operation sub controller 28 is involved and determined in plural states (two states in this case) and the overall operation is synchronous with a clock. This is the reason why the synchronous feedback loop 34 includes the command generating circuit 26 and the command timing adjuster 27.

The third case uses the asynchronous feedback loop 36. The asynchronous feedback loop 36 is formed by the command generating circuit 26, the command timing adjuster 27, the asynchronous circuit 38, the handshake signal timing adjuster 29, and the next state generating circuit 24. The asynchronous feedback loop 36 is used at the time of access to the system memory 10 or the bit map memory 14. The asynchronous circuit 38 serves as an interface between the system memory 10 and the bit map memory 14, and the RLC operation controller 20. In the third case, the synchronous feedback loop 32, as well as the asynchronous feedback loop 36, is used. The synchronous feedback loop 34 is not used in the third case.

The next state generating circuit 24 determines the next state based on outputs of the RLC operation control counter 22 and the handshake signal timing adjuster 29 and feeds back, along a path, which is a part of the synchronous feedback loop 32, to an input of the RLC operation control counter 22. The next state is determined, through the synchronous feedback loop 32, with respect to four states. To be more concrete, a state following a state where memory access is started to the asynchronous circuit 3-8 is determined. For example, after an instruction for reading out the system memory is issued to the asynchronous circuit 38, whether a current state remains unchanged (that is, memory access is continued) or transits to the next state is determined, based on a handshake signal after timing thereof is adjusted.

TABLE 2

| State Codes | States | Types of Feedback Loops Involved in Determining Next State |
|---|---|---|
| 0000 | Wait | Synchronous Feedback Loop 32 |
| 0001 | Mode Detect/Memory Read start | Asynchronous Feedback Loop 36 (True Memory Access) |
| 0010 | Mode Detect/Detect Memory Read End | Synchronous Feedback Loop 34 (True Memory Access) |
| 0011 | Mode Branch | Synchronous Feedback Loop 32 (True Memory Access) |
| 0100 | Memory Read Start in Absolute and Run Modes | Asynchronous Feedback Loop 36 (True Memory Access) |
| 0101 | Detect Memory Read End in Absolute and Run Modes | Asynchronous Feedback Loop 32 (True Memory Access) |
| 0110 | Memory Write Start in Absolute and Run Modes | Asynchronous Feedback Loop 36 (True Memory Access) |
| 0111 | Detect Memory Write End in Absolute and Run Modes | Synchronous Feedback Loop 34 (True Memory Access) |
| 1000 | Determine Next Operation in Absolute and Run Modes | Synchronous Feedback Loop 32 (True Memory Access) |
| 1001 | Memory Read Start in Skip Mode | Asynchronous Feedback Loop 36 (True Memory Access) |
| 1010 | Detect Memory Read End in Skip Mode | Asynchronous Feedback Loop 32 (Pseudo Memory Access, Loop 36 not involved.) |
| 1011 | Pseudo Memory Write in Skip Mode | Asynchronous Feedback Loop 32 (Pseudo Memory Access, Loop 36 not involved.) |
| 1100 | Detect Skip Mode End | Synchronous Feedback Loop 34 |
| 1101 | Undefined | Synchronous Feedback Loop 32 |
| 1110 | Undefined | Synchronous Feedback Loop 32 |
| 1111 | Undefined | Synchronous Feedback Loop 32 |

Table 2 shows that with respect to a current state, the next state is determined by using any of the synchronous feedback loop 32, the synchronous feedback loop 34, and the asynchronous feedback loop 36. In the table, five states of "0000", "0011", "0101", "1000", and "1010" involve memory initialization. Involved in memory initialization are also four cases where the asynchronous feedback loop 36 is used, as well as cases such as states of "0000", "0011", "0101" and "1010" (-skip mode)" where a pseudo write instruction for the bit map memory is generated and an response from the asynchronous circuit 38 is not used.

Figure 6:
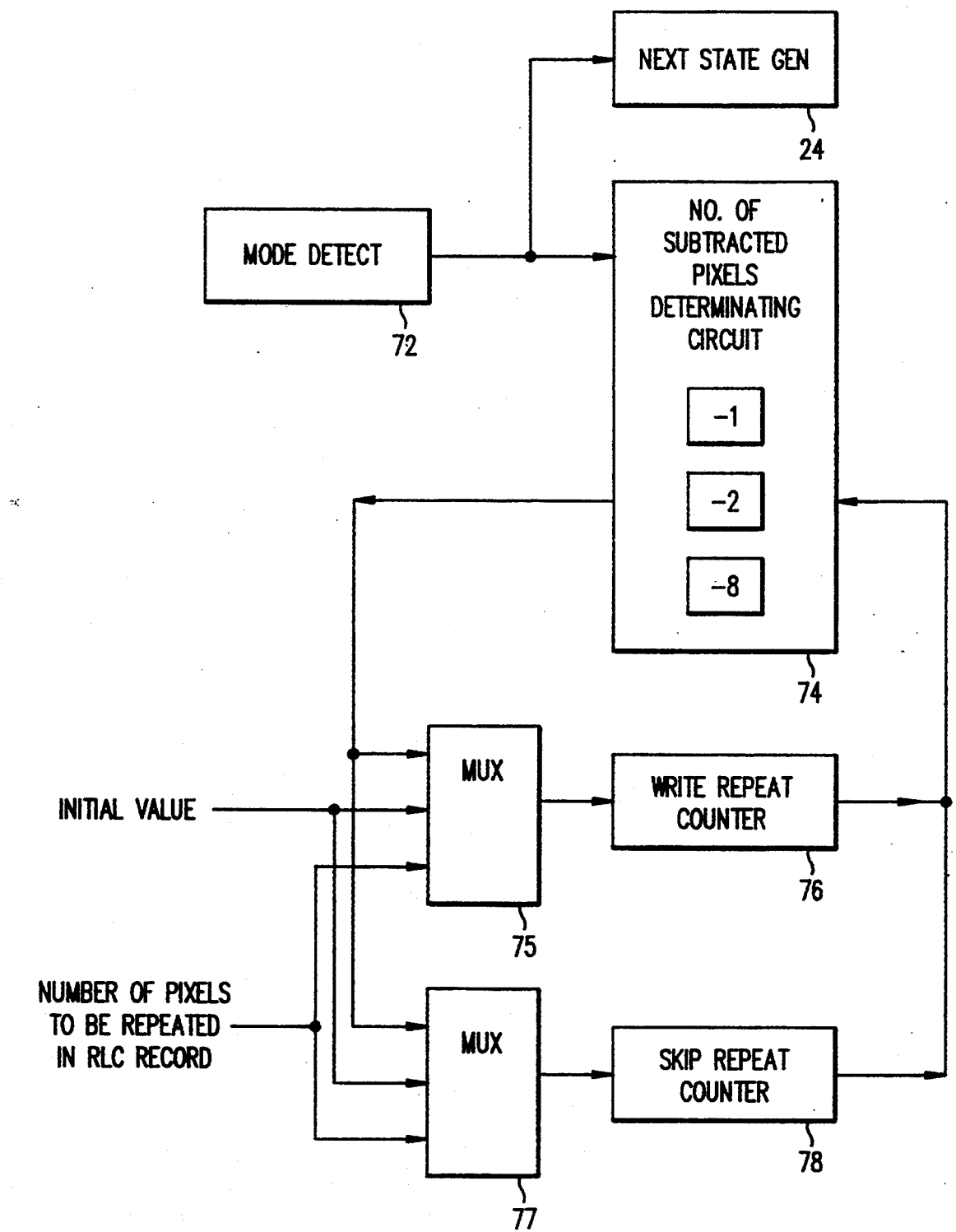
FIG. 6 is a block diagram showing the configuration of a RLC operation sub controller in the RLC decoder.

FIG. 6 shows the configuration of the RLC operation sub controller 28. The RLC operation sub controller 28 include a mode detecting circuit 72, a subtracted pixels determining circuit 74, a write repeat counter 76, and a skip repeat counter 78. An output of the mode detecting circuit 72 is provided not also to the next state generating circuit 24, but also to the subtracted pixels determining circuit 74. In the run and absolute modes, upon the time when the data is written into the bit map memory, a bit width of data to be written is to be determined according to a value of the write repeat counter 76. The value of the write repeat counter 76 is fed back also to the next state generating circuit 24 to determine the next state. Outputs of the write repeat counter 76 and the skip repeat counter 78 are provided to the subtracted pixels determining circuit 74, where any of the values of one, two, and eight pixels is subtracted, according to the output of the mode detecting circuit 72, from the number of pixels from- the write -repeat counter 76 and the skip repeat counter 78 and a result thus obtained is provided, through multiplexers 75 and 77, to the write repeat counter 76 and the skip repeat counter 78.

In the run mode, a bit width of data to be written at a time into the bit map memory 14 is determined according to a value of the write repeat counter 76 as follows. The data to be written into the bit map memory 14 comes from the RLC graphic data controller 30 (FIG. 3) and the bit width (bus width) of a bus for data to be written is 64 bits. Accordingly, if 8-bit data is used for each pixel, data of eight pixels can be written at a time. The write repeat counter 76 retains information on the number of pixels to be written. If a value of the write repeat counter 76 indicates that the number of pixels to be written into the bit map memory 14 is 16 or more, the maximum bits of bus width, that is, the width of 64 bits (eight pixels) can be written. Some values of the write repeat counter 76 and the physical address generating circuit 40 may indicate that a bit width of data to be written into the bit map memory 14 is two pixels (16 bits) or one pixel (8 bits). Also in the absolute mode, a bit width of bits to be written is selective in that it is either one or two pixels. If a value of the write repeat counter 76 is greater than or equal to 1, a state is determined to be write repeat in the run or absolute mode. If a value of the write repeat counter 76 is zero, a decision to transit to a state where the next RLC code is read out is made.

The skip repeat counter 78 is used in the skip mode. In the skip mode, the RLC operation sub controller 28 tells the command generating circuit 26 that a write operation for the bit map memory 14 in the skip mode is performed by a pseudo instruction. As a result, a memory access command is not directed to the asynchronous circuit 28. To be more concrete, a write instruction is inputted to one input of an AND circuit (not shown), a mask command is inputted to the other input thereof, and an output is provided to the asynchronous circuit 28. The physical address generating circuit 40 continues to increase addresses the same as in the run mode. In this case, the skip repeat counter 78 performs the same operation as the write repeat counter 76 in the run mode. A pseudo write operation uses two states, with a handshake signal from the asynchronous feedback loop 36 remaining the end of handshake state. Two states are a pseudo write state ("1011") and a write end state ("1100"). To increase addresses in the physical address generating circuit 40, it is necessary to generate a clock. This is the reason why two states are used.

A value of the skip repeat counter 76 is fed back to the next state generating circuit 24 to determine the next state. That is, if a value of the skip repeat counter 76 is greater than or equal to 1, a state is determined to be a skip. If a value of the skip repeat counter 78 is zero, a decision to transit to a state where the next RLC code is read out is made. To sum up, a skip code in a RLC code is read out from the system memory 10, then loaded into the skip repeat counter 78, and then the contents o-f the skip repeat counter 78 are updated in the timing of end of pseudo instruction.

The command generating circuit 26 generates an access signal for access to the system memory 10 and the bit map memory 14 in accordance with the contents of the RLC operation control counter 22. The command generating circuit 26 generates a counter load signal for the write repeat counter 76 and the skip repeat counter 78. The command generating circuit 26 generates a memory access signal in a state, which is indicated by the RLC operation control counter 22, where reading out a RLC code is started or- in a state where a write operation to the bit map memory 14 is started in the run or absolute mode. In the skip mode, a pseudo write instruction occurs, but it is masked before it is provided to the asynchronous circuit 38. A counter load signal for the write repeat counter 76 and the skip repeat counter 78 is a timing signal indicating the read end for the information of repeated RLC code.

Figure 7B:
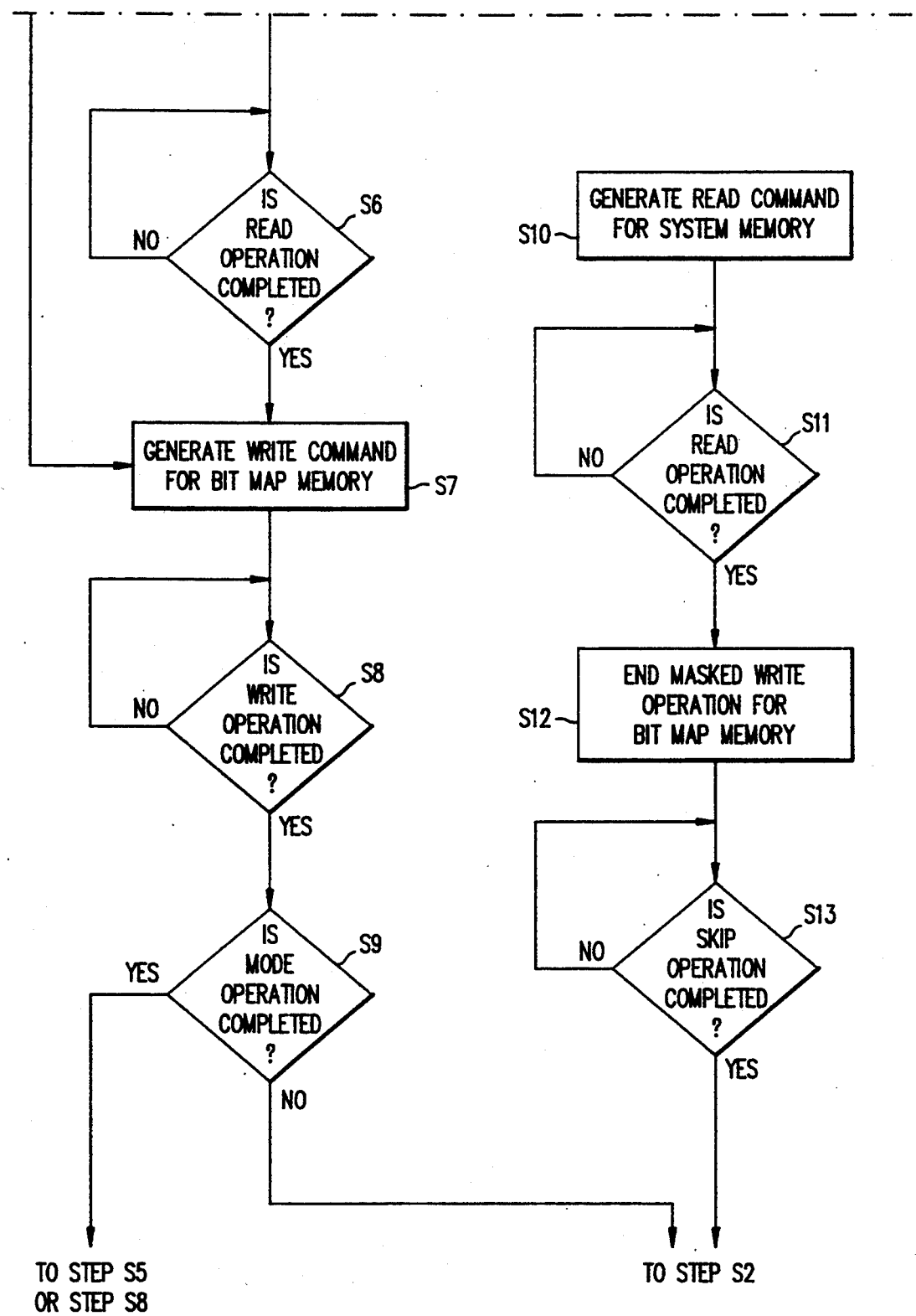
FIG. 7 is a flowchart showing the operations of the RLC operation controller.

FIG. 7 is a flowchart showing the operations of the RLC operation control counter 22. When 1 is written to the start operation instruction bit 19A in the start operation register 19, that is, when a kickoff command indicating the beginning of run length codes (RLC) is read from the system memory 10 (Step S1), the command generating circuit 26 generates a read out command for the system memory 10 (Step S2). When the end of read operation is detected by means of the asynchronous feedback loop 36 (Step S3), -the RLC operation sub controller 28 determines that an operation is to be performed in which mode (Step S4). If a code is EOF indicating the end of frame, the processing goes to Step S1. If the code is EOL indicating the end of line, the processing goes to Step S2. If the code indicates the absolute mode, the command generating circuit 26 generates a read command for the system memory 10 (Step S5).

Figure 11:
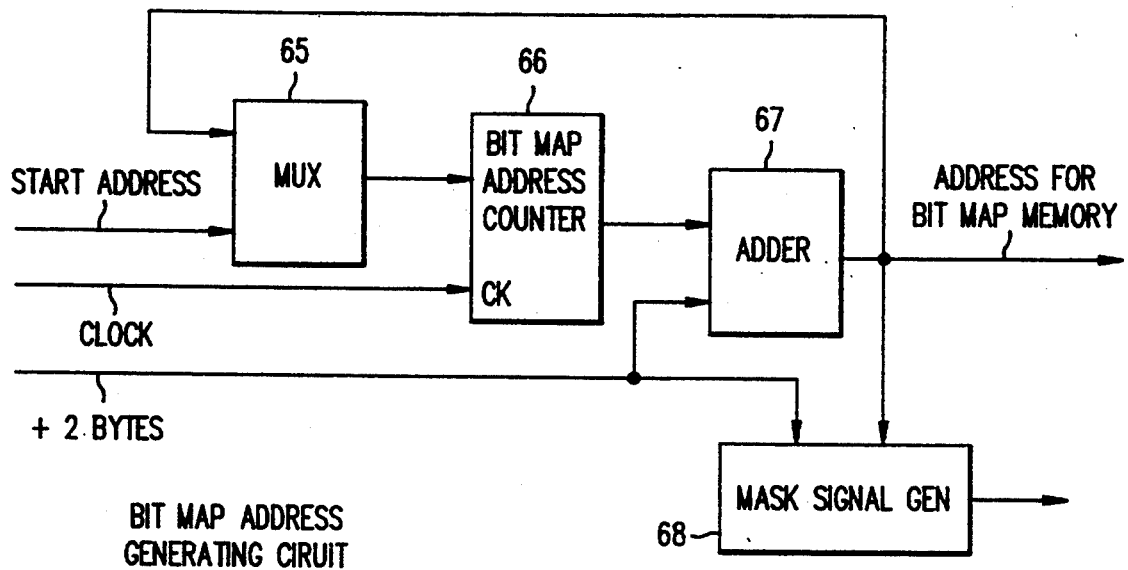
FIG. 11 is a block diagram showing a bit map memory address generating circuit in the physical address generating circuit.

The read out address for the system memory 10 is previously stored in a read start address register 82 (FIG. 3) in the I/O register group 18 of the decoder 12A. When EOF is detected, the processing is returned to Step S1 to complete the operation with the start operation instruction bit 19A reset. At the time of detection of EOL, an offset value is added to a current write start address to set the write start address to an address value corresponding to a top display position in a display line to be displayed next. The write start address is previously stored in a write start address register 84 (FIG. 3). Addition of the offset value reflects on a value of a bit map address counter 66 of a bit map memory address generating circuit 40B (FIG. 11). The offset value is accumulated for each EOL and the write start address register 84 always retains a top address of a display line being written into the bit map memory 14. With respect to RLC codes in the absolute mode, write color data can be obtained by reading out the system memory 10. A read address is obtained by adding 2 to the contents of the read start address register 82. This add operation is automatically performed by the decoder 12A.

When the read operation for the system memory 10 is completed (step S6), the command generating circuit 26 generates a write command for the bit map memory 14 (Step S7). When the write operation for the bit map memory 14 is completed (step S8), the next state generating circuit 24 determines whether a running mode is terminated based on information from the RLC operation sub controller 28 (Step S9). If a decision to terminate the running mode is made, the processing goes to S2. If a decision is to terminate the running mode is not made, the processing goes to Step S8 in the case where the running mode is the run mode and goes to Step S8 in the case where the running mode is the run mode and to Step S5 or Step S8 in the case where the running mode is the absolute mode (Step S9). The processing goes to S5 or S8 based on the low-order bits of an address transmitted to the RLC operation sub controller 28 (FIG. 4) from the physical address generating circuit 40 (FIG. 3).

The decoder 12A and the bit map memory 14 are connected, through a bus of 64 bit width, to each other. In the absolute mode, if a write operation for the bit map memory 14 starts with an odd-byte address and an address is increased while data is written with an address boundary for each 8 bytes (64 bits) spanned, a single write operation for one word (16 bits, that is, two pixels) is divided into two write operations each of which writes one byte (8 bits, that is, one pixel) so as to suit the address boundary. A decision whether a write operation spans the address boundary is made, as described above, by reference to the several low-order bits of a address of the physical address generating circuit 40 retaining the address to be written next. As a result of the reference to the several low-order bits of the physical address generating circuit 40, one-bit information indicating whether a cross boundary is present or not can be obtained and the one-bit information is transmitted from the RLC operation sub controller 28 to the next state generating circuit 24 to determine the next state. The above processing of the cross boundary occurs also in the run mode and takes place in the same hardware as in the absolute mode.

Figure 8:
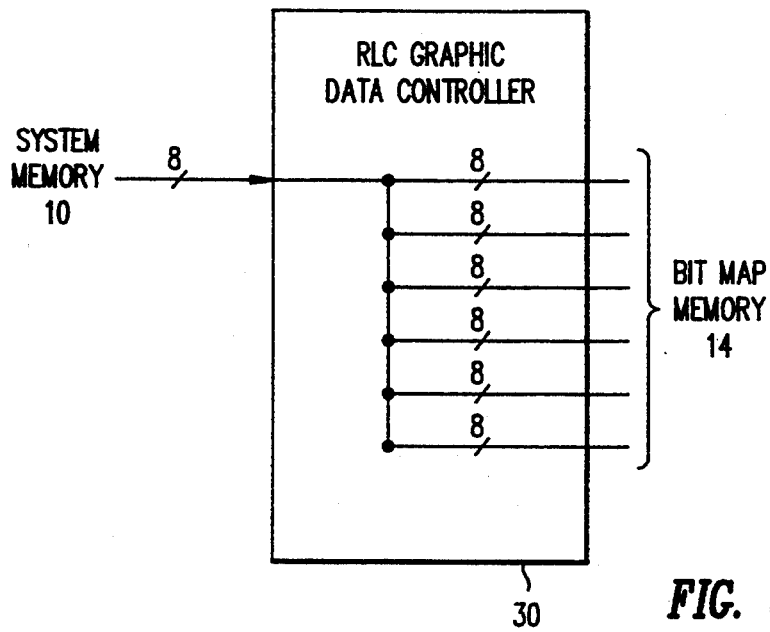
FIG. 8 is a block diagram showing the data expansion in a RLC graphic data controller in the RLC decoder.

If Step 4 determines that the run mode is to be run, the processing goes to Step S7. Step 2 reads 2-byte data from the system memory 10, one byte of which specifies the run mode and indicates the number of continuous pixels in a single run mode and the other byte of which indicates a color to be written. The 8-bit data indicating the color to be written is acquired by the RLC graphic controller 30 (FIG. 3), expanded to 64 bits, as shown in FIG. 8, and then transmitted over the data bus connected to the bit map memory 14. The data expansion is completed before Step S7 is reached.

If Step S4 determines that the skip mode is to be run, the processing goes to Step S10. In Step S10, the command generating circuit 26 generates a read command for the system memory 10. If it is determined by means of the asynchronous feedback loop 36 that the read operation is completed (Step S11), the command generating circuit 26 functions under the instructions of the RLC operation sub controller 28 to mask a write operation for the bit map memory 14 (Step S12). Them ask operation is performed without waiting for a response from the asynchronous feedback loop 36. In Step S13, the RLC operation sub controller 28 determines whether a jump (skip operation) over an address point to the bit map memory 14 is completed. If the skip operation is not completed, the processing returns to Step S12. If the skip operation is completed, the processing returns to Step S2.

Step S10 performs the read operation for the system memory 10 in order to obtain a range of skip in the vertical and horizontal directions. A range of skip in the vertical direction is represented by the number of display lines, on the other hand, a range of skip in the horizontal direction is represented by the number of pixels. These amounts of data is acquired by the RLC operation sub controller 28. As shown in FIG. 6, the skip repeat counter 78 of the RLC operation sub controller 28 comprises a vertical skip repeat counter 78A and a horizontal skip repeat counter 78B. In Steps S12 and S13, a pseudo memory write state where a write signal for the bit map memory 14 is prevented from being to be active is repeated. Excepting that a write enable signal is masked, an operation in the state is much the same as an operation in the run mode. However, the pseudo write operation is repeated at a fast rate twelve times as large as the operation in the run mode since it is unnecessary to wait for a response fro-m the bit map memory 14.

The pseudo write operation is performed at such a faster rate in the skip mode for the reason that although the transition of states is executed to the timing of a clock signal (50 MHz, that is, 20 nanoseconds), it takes approximately 240 nanoseconds to access to the bit map memory 14. For each pseudo write operation, a value of the horizontal skip repeat counter 78B is decreased by eight pixels, two pixels, or one pixel. If the value of the horizontal skip repeat counter 76B becomes zero, not only a value of the vertical skip repeat counter 78A is decreased by one, but also the number of pixels corresponding to a single display line, for example, 640 is loaded into the horizontal skip repeat counter 78B and a pseudo write operation is repeated. Such a repetitious operation continues until the both contents of the vertical and horizontal skip repeat counters 78A and 78B reach zero.

A write enable signal for the bit map memory 14 is masked during a pseudo write operation, but a value of a bit map address counter 66 (FIG. 11) of the physical address generating circuit 40, which retains an address value for the bit map memory 14, is updated according to a number from which value of the horizontal skip repeat counter 78B is subtracted. For example, if a value of the horizontal skip repeat counter 78B is decreased by 8, then an address of the physical address generating circuit 40 is -increased by 8. When both contents of the vertical and horizontal skip repeat counters 78A and 78B reach zero, the RLC operation sub controller 28 causes a signal indicating the end of skip to be active and provides the signal to the next state generating circuit 24. Then the processing returns to Step S2 based on some determination in the next state generating circuit 24. Since an operation in the skip mode, which is assumed as a pseudo write operation, has many portions which are common to an operation in the run mode, circuits for performing the operation in the skip mode and the operation in the run mode have many portions which are common to each other, and implicitly in hardware configuration can be implemented. This does not obstruct a fast write operation for memory in the case where the skip mode is used.

The above description can be summed up as follows. If the CPU 2 sets the start operation instruction bit 19A of the start operation register 19 to true, the decoder starts to operate. First, the first two bytes of a RLC code are read out from the system memory 10, based on an address value previously loaded in the system address counter 62 of the physical address generating circuit 40. Since the read-out two bytes contain information specifying a type of mode to be executed, the processing branches to -a state according to a specified mode. In some modes specified, it is necessary to read out data again from the system memory 10. Data is read out from the system memory 10 in a unit of word (two bytes), and the contents of the system address counter 62 of the physical address generating circuit 40 are increased by 2 accordingly each time reading out from the system memory 10 is completed.

A write operation for the bit map memory 14 is performed in the run and absolute modes. In the run mode, a write operation is performed, according to the number of remaining pixels to be written, in a unit of 64, 16, or 8 bits. To perform a write operation in a unit of 16 or 8 bits through the bus of 64-bit width, a write per bit function a usual DRAM provides is used. In the absolute mode, a write operation is performed in a unit of 16 or 8 bits, depending on whether an address boundary is spanned. A -write address to the bit map memory 14 is designated by the bit map memory address counter 66 (FIG. 11) of the physical address generating circuit 40. The counter 66 designates a byte address, to which 8, 2, or 1 is added according to the number of written bits at the time of the completion of a write operation. A skip operation is basically the same as a write operation in the run mode except that a write enable signal is masked. The decoder 12A ends with only EOF.

Figure 9:
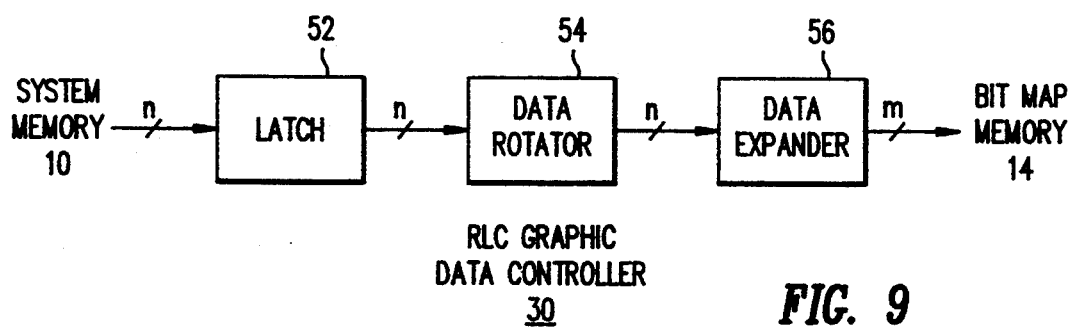
FIG. 9 is a block diagram showing the whole configuration of the RLC graphic data controller in the RLC decoder.

FIG. 9 shows the configuration of the RLC graphic data controller 30. The RLC graphic data controller 30 reads out data from the system memory 10 and prepares to write the data to the bit map memory 14. In the case of the run mode, the read out data is retained by a latch 52 until the next data is read out from the system memory 10. A data rotator 54 is used to write data of n bit width from the system memory 10 into the bit map memory 14 as the data of m bit width. In accordance with a running mode and an- address generated by the physical address generating circuit 40, the RLC operation controller 20 operates the data rotator 54. A data expander 56 expands n bit width of data into m bit width.

In the run mode, the data rotator 54 does not operate and 8 bit-data for each pixel is merely expanded into 64-bit data (Refer to FIG. 8). In the absolute mode, rotation for 8 bit-data is determined depending whether 16-bit data (two pixels) is written into an odd address or an even address. The 16-bit data is written for the reason that if the absolute mode was determined, an attempt to read out data from the system memory 10 is made again and data (word data) corresponding to two pixels is to be acquired by the RLC graphic data controller 30. In the absolute mode, a 16-bit output of the data rotator 54 is expanded into 64 bits. Data is expanded same as in expansion by parallel copying in the run mode. As described above, a value of n in FIG. 9 is 8 or 16 in the run or absolute mode, respectively and a value of m is 64.

Figure 10:
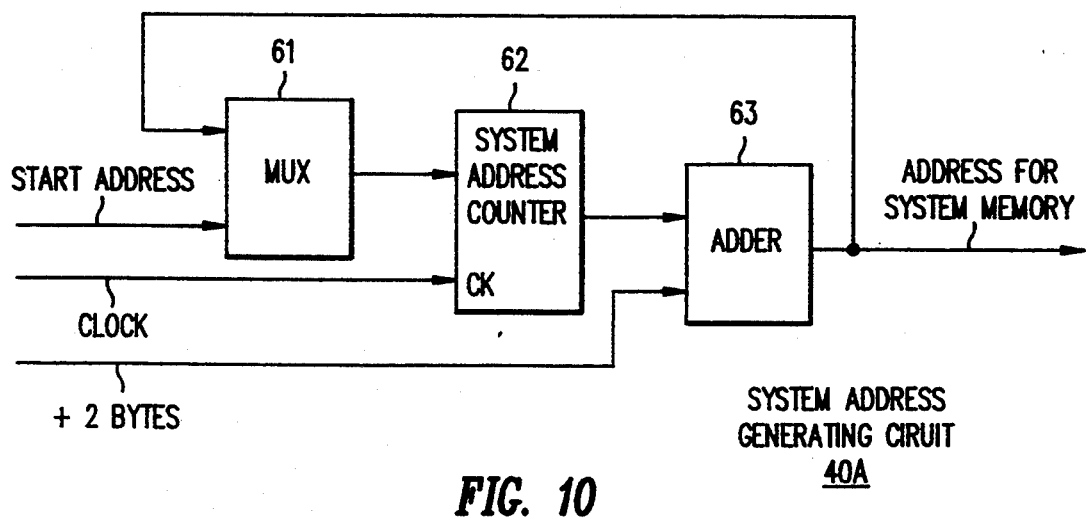
FIG. 10 is a block diagram showing a system memory address generating circuit in a physical address generating circuit.

FIG. 10 and FIG. 11 show respective portions different from each other of the physical address generating circuit 40. The physical address generating circuit 40 comprises the system memory address generating circuit 40A (FIG. 10), which generates an address for the system memory 10 and the bit map memory address generating circuit 40B (FIG. 11), which generates an address for the bit map memory 14.

Referring again to FIG. 10, the system memory address generating circuit 40A includes a multiplexer 61, the system address counter 62, and an adder 63. The adder 63 always add 2 bytes to a current address. The system address counter 62 comprises plural D-type flip-flops arranged in parallel. A start address used by the system memory address generating circuit 40A is previously loaded, by the CPU 2, into a read start address register 82 (FIG. 3) in the I/O register group 18 of the decoder 12A. When a write operation is performed for the read start address register 82, the MUX 61 selects a start address in the register 82 and loads the start address into the system address counter 62 in the timing of the completion of writing to the register 82. A system memory address is always a byte address and a clock is provided to the system address counter 62 in the timing of the completion of reading out from the system memory. When a clock is provided to the system address counter 62 while the MUX 61 is selecting an output of the adder 63, 2 is added to the contents of the system address counter 62.

The bit map memory address generating circuit 40B of FIG. 11 includes a multiplexer 65, the bit map address counter 66, an adder 67, and a mask signal generating circuit 68. The adder 67 always adds j bit(s) to a current address. A value of j is determined following instructions from the RLC operation sub controller 28. For byte access, j=1. For word access, j=2. For a write operation for 64 bits (entire bus width) in the run mode, j=8. Also for a pseudo write operation for 64 bits in the skip mode, j=8. A start address for the bit map memory address generating circuit 40B is previously loaded, by the CPU 2, into a write start address register 84 (FIG. 3). When a write operation is performed for the register 84, a start address is loaded also into the bit map address counter 66 in the timing of the completion of writing to the register 84.

The mask signal generating circuit 68 generates a signal (mask signal) for masking a part of the bus width of 64 bits. The mask signal is used at the time of writing 8-bit or 16-bit data in the absolute mode. The mask signal is a 64-bit signal that enables a data bit position, which allows writing within a bus width of 64 bits, to be written and disables other data bit positions from being written. The mask signal is timing multiplexed with write data generated by the RLC graphic data controller 30 and provided to a data line of the DRAM forming the bit map memory 14. The write per bit function of the DRAM write masks write disabled bits. A mask signal generated by the mask signal generating circuit 68 is not related to masking by a write enable signal in the skip mode.

Figure 12:
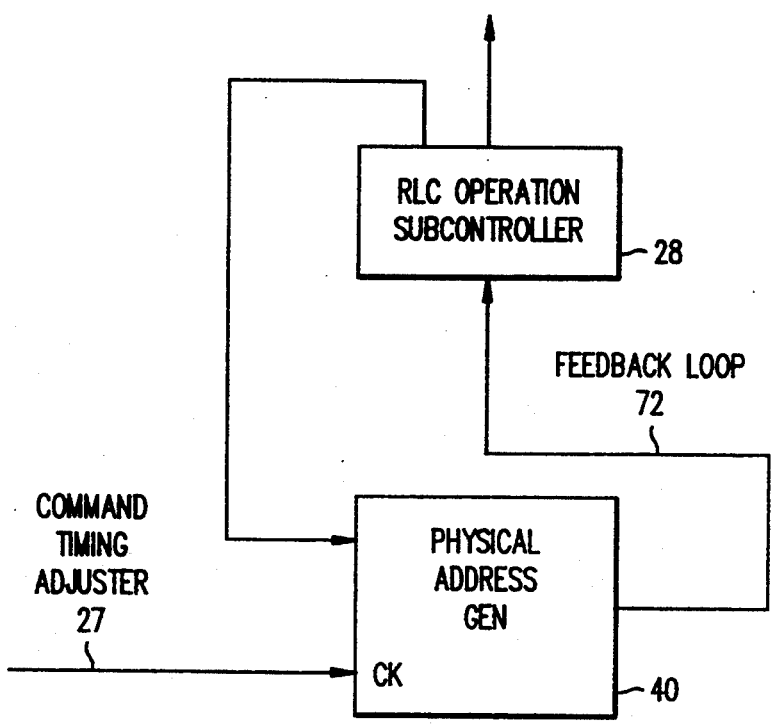
FIG. 12 is a block diagram showing a feedback loop between the physical address generating circuit and the RLC operation sub controller in the RLC decoder.

As shown in FIG. 12, a feedback loop 72 is formed between the bit map memory address generating circuit 40B and the RLC operation sub controller 28. The low-order bits of an address for the bit map memory 14 is transmitted to the RLC operation sub controller 28 and then is used to determine the operation of the adder 67. In the absolute mode, if the reining pixels to be written are two (16 bits) or more pixels and the low-order bits of a current address are "111", the next write operation for the bit map memory 14 is repeated twice in a unit of byte so that an address boundary originating in the bus width of 64 bits can be processed. This processing requires the feedback loop 72.

As described above, according to the embodiment, a skip entry is provided for decoding run length codes to lower the frequency of writing into the bit map memory 14, so that a rate at which run length codes are decoded and then written into the bit map memory 14 can be increased. With respect to a range which does not require to be rewritten, since data conventionally represented by plural run length codes can be replaced with one skip entry, the rate of compression of data can be increased by including skip codes in run length codes.

Extensions

In the embodiment, run length codes are decoded by hardware. However, it will be appreciated that the run length codes may be decoded by software. Further, the above mentioned run length codes were assumed to be codes in a unit of 2 bytes. However, it will be appreciated that the run length codes may be codes in a unit of bytes other than 2 bytes. Still further, said skip entry designates a skip range with quantities of skip in the horizontal and vertical directions. However, it will be appreciated that the skip entry may be a code designating a quantity of skip in either horizontal or vertical direction. Further, in the embodiment, a quantity of skip in the horizontal direction corresponds to the number of pixels, while a quantity of skip in the vertical direction corresponds to the number of display lines. However, it will be appreciated that a quantity of skip is not limited to the above correspondence.

These and other extensions of the invention may be made without departing from the spirit and scope thereof as recited in the appended claims.

1. In a system having a symbol addressable memory, a source of run length coded symbol strings, means for writing symbol strings from the source into counterpart memory addresses in raster scan line order, and means for reading and displaying the contents of memory addresses in raster scan line order, a method for rapidly writing said symbol adressable memory comprising the steps of:
    (a) embedding coded indicia descriptive of run attributes in predetermined positions in each symbol string in said source, said indicia including a start of string, symbol string length, and symbol similarity or dissimilarity; and
    (b) responsive to commands for writing at least one symbol string from said source into said symbol addressable memory, ascertaining the run attributes from the coded indicia embedded in the symbol string, and, either writing said symbol string in raster scan line order into said symbol addressable memory if the indicia indicate at least two of the string symbols are dissimilar, or, skipping memory addresses in raster scan line order counterpart to symbols in the string if the indicia indicate the string symbols are similar.

2. The method according to claim 6, wherein said writing step occurring at a first synchronous rate of accessing memory addresses in raster scan line order, and further wherein said skipping step includes disabling the writing means over a predetermined number of memory addresses, said disablement of said writing means effectuating a synchronous rate for accessing memory addresses in raster scan line order higher than the first synchronous rate.

3. A method as recited in claim 2 wherein said coded indicia comprises a skip entry portion and a skip range portion, said skip range portion specifies storage locations in said symbol addressable memory.

4. A method as recited in claim 3 wherein said skip range portion specifies number of pixels and number of display lines to be skipped.

5. A data processing system comprising a display apparatus, an external storage apparatus for storing display data represented by run length codes, a CPU for reading out the display data from the external storage apparatus, a system memory having areas for storing the display data read out from the external storage apparatus, and a bit map memory for storing the display data in storage locations corresponding to display positions of the display apparatus, wherein said system further comprises:
    means for decoding a display data in the system memory and writing the decoded display data to the bit map memory; and
    a video controller including said decoding means for transmitting a video signal to said display apparatus based on the display data in the bit map memory and the storage locations for the display data, in response to a predetermined code in a run length data flow, said decoding and writing means, responsive to coded indicia in a bit string defining a string where at least two bits have dissimilar values, writing the string of dissimilar bit values into the bit map memory at a first bit rate, and responsive to coded indicia in a bit string defining a string of the same value bits, skipping over a predetermined range of storage locations in the bit map memory at a second bit rate higher than the first bit rate.

6. A system as recited in claim 5 wherein said coded indicia comprises a skip entry portion and a skip range portion, said skip range portion specifies storage locations in said symbol addressable memory.

7. A system as recited in claim 6 wherein said skip range portion specifies number of pixels and number of display lines to be skipped.

* * * * *

UNITED STATES PATENT AND TRADEMARK OFFICE
CERTIFICATE OF CORRECTION

PATENT NO. : 5,422,995
DATED : June 6, 1995
INVENTOR(S) : Aoki et al.

It is certified that error appears in the above-indentified patent and that said Letters Patent is hereby corrected as shown below:

Column 14, line 38, delete "6", insert --1--.

Signed and Sealed this

Twelfth Day of December, 1995

Attest:

BRUCE LEHMAN

*Attesting Officer*     *Commissioner of Patents and Trademarks*